(12) United States Patent
Sato et al.

(10) Patent No.: US 6,312,338 B1
(45) Date of Patent: Nov. 6, 2001

(54) ELECTRONIC ACCESSORY FOR GAME MACHINE

(75) Inventors: Masaki Sato; Kazunori Koshiishi, both of Kyoto (JP)

(73) Assignee: Nintendo Company, Ltd., Kyoto (JP)

( * ) Notice: Subject to any disclaimer, the term of this patent is extended or adjusted under 35 U.S.C. 154(b) by 0 days.

(21) Appl. No.: 09/466,898

(22) Filed: Dec. 20, 1999

Related U.S. Application Data

(63) Continuation-in-part of application No. 29/095,325, filed on Oct. 21, 1998, now Pat. No. Des. 419,198
(60) Provisional application No. 60/164,858, filed on Nov. 12, 1999.

(51) Int. Cl.7 .......................................................... A63F 9/24
(52) U.S. Cl. ................................................. 463/44; 463/46
(58) Field of Search .................................. 463/43, 44, 45, 463/46, 47

(56) References Cited

U.S. PATENT DOCUMENTS

| D. 375,304 | 11/1996 | Takahata et al. ..................... D14/121 |
|---|---|---|
| D. 376,795 | 12/1996 | Ashida ................................. D14/121 |
| D. 377,488 | 1/1997 | Ashida ................................. D14/121 |
| D. 381,647 | 7/1997 | Terng .................................. D14/124 |
| D. 382,868 | * 8/1997 | Ashida ................................. D14/121 |
| 3,904,933 | * 9/1975 | Davis .................................... 317/100 |
| 4,628,992 | * 12/1986 | Kennedy .............................. 165/123 |
| 4,865,321 | 9/1989 | Nakagawa et al. ................. 273/85 G |
| 5,212,368 | 5/1993 | Hara ..................................... 235/375 |
| 5,362,068 | 11/1994 | Liu ....................................... 273/435 |
| 5,673,176 | * 9/1997 | Penniman et al. ................... 361/687 |
| 5,742,478 | * 4/1998 | Wu ....................................... 361/704 |

\* cited by examiner

*Primary Examiner*—Jessica J. Harrison
*Assistant Examiner*—Kim T. Nguyen
(74) *Attorney, Agent, or Firm*—Nixon & Vanderhye PC

(57) ABSTRACT

An electronic accessory for a game machine, adapted to be externally loaded to the game machine into a corresponding connector formed in the game machine body, that includes a housing having slits in a wall thereof for dissipating heat generated by the electronic components of the accessory. To facilitate dissipation of heat within the housing and to the exterior through the slits, a heat radiation frame or assembly is disposed within the housing and includes at least a first heat radiation part disposed between the electronic components and the housing wall. The heat radiation framework of the preferred embodiment is made from a metal material and is generally L-shaped or T-shaped, including a second heat radiation section or part extending generally perpendicular to the first heat radiation part. Heat energy generated by the electronic components of the accessory is transmitted from the electronic components through a thermal sheet to the first heat radiation part from where some heat can be dissipated through the slits in the housing. Additional heat is conducted via the first heat radiation section to the second heat radiation section for dissipation through holes in a protective shield coupled thereto.

22 Claims, 5 Drawing Sheets

ELECTRONIC ACCESSORY FOR GAME MACHINE

This application is a continuation-in-part of U.S. application Ser. No. 29/095,325, which was filed Oct. 21,1998, now the U.S. Pat. No. D419,198 the disclosure of which is incorporated herein by this reference. This application claims the benefit of U.S. Provisional Application Ser. No. 60/164,858, which was filed Nov. 12, 1999, the disclosure of which is incorporated herein by this reference.

BACKGROUND OF THE INVENTION

1. Field of the Invention

The invention relates to computer accessories, such as software games and expansion RAM provided as peripheral computer accessories. More specifically, the invention relates to an electronic accessory, which may be in the form of a cartridge adapted to be externally loaded to a software game machine platform or game machine controller.

2. Description of the Related Art

Conventional electronic accessories such as memory expansion packs and game cartridges for game machines are comprised of a board loaded with electronic components including memory, stored game program(s) and a case or housing covering the board. A formed connector part is defined on the board for being coupled to the game machine and an aperture is formed in one end of the case so as to expose the connector. In this manner, the accessory can be mounted to the game machine for game play.

Technical advances in the bandwidth associated with game machines in recent years have resulted in greater data processing rates. Indeed, these data processing rates have increased exponentially. As a result, electronic power consumption has been increasing not only in the electronic components contained in the game machine body, such as the CPU, but also in the electronic accessories used therewith. An unavoidable by-product of this electrical consumption is the generation of heat. The accessories, such as cartridges for game machines, which are typically loaded from above, are affected to a greater extent by heat radiating from electronic components within the game machine body. In that regard, the generated heat, which is normally transmitted upwardly, creates an environment for the accessory that can cause premature deterioration. Moreover, if heat radiating from the electronic accessory itself is not effectively dissipated, it can damage the electronic components in the game machine body located therebelow.

BRIEF SUMMARY OF THE INVENTION

It is an object of the invention to solve the above-described problem by effectively discharging heat that is generated by the electronic components contained within an accessory for a game machine.

It is a further object of the invention to evenly distribute the generated heat without detrimentally affecting the game machine body with which the accessory is used.

The foregoing and other objects of the invention are achieved by providing an electronic accessory for a game machine, adapted to be externally loaded to the game machine into a corresponding connector formed in the game machine body, that includes a housing having slits in a wall thereof for dissipating heat generated by the electronic components of the accessory. To facilitate dissipation of heat within the housing and to the exterior through the slits, in the presently preferred embodiment, a heat radiation frame or assembly is advantageously disposed within the housing between the electronic components and the housing wall. Thus, the accessory provided in accordance with a preferred embodiment of the invention is comprised of a main board, a cover or housing, and a heat radiation framework disposed therebetween. The board incorporates electronic components, including memory, on at least one side surface thereof and defines a connector terminal at a free end thereof. The housing is uniquely formed and shaped, in a preferred embodiment of the invention, to cover both the one, principal side and the opposite side of the board. The heat radiation framework of the preferred embodiment is made from a metal material and is generally L-shaped, including a first heat radiation section or part that is installed along the one, principal surface of main board and a second heat radiation section or part extending generally perpendicular to the first heat radiation section. In the presently preferred embodiment, the first heat radiation section is engaged with a shield installed along the one side of the main board and extends to the inner end of the board. Furthermore, in the presently preferred embodiment, heat energy generated by the electronic components of the accessory is transmitted from the electronic components through a thermal layer or sheet to the first heat radiation section from which some heat can be dissipated through the slits in the housing. Additional heat is conducted via the first heat radiation section to the second heat radiation section for dissipation through holes in a protective shield coupled thereto.

Accordingly, the assembly provided in accordance with the invention allows heat generated by the electronic components to be transferred, initially to the first heat radiation section, for dissipation. Excess heat can be transmitted from the first radiation section to the second heat radiation section for dissipation to the outside of the accessory.

Thus, the structure provided in accordance with the invention is effective to discharge excess heat in an electronic accessory, such as a memory expansion pack and/or a game cartridge assembly. However, the excess heat discharge does not interfere with heat emanating from the game machine body and thus does not retard heat dissipation from the game machine nor adversely effect the electronic components of the game machine. As is further evident from the foregoing, in accordance with the invention, the heat discharged from the electronic accessory does not dwell in the vicinity of the electronic components and thereby effectively minimizes deterioration of the electronic components due to heat build up.

BRIEF DESCRIPTION OF THE DRAWINGS

These, as well as other objects and advantages of this invention, will be more completely understood and appreciated by careful study of the following more detailed description of the presently preferred exemplary embodiments of the invention taken in conjunction with the accompanying drawings, in which.

DETAILED DESCRIPTION OF THE INVENTION

Figure 1:
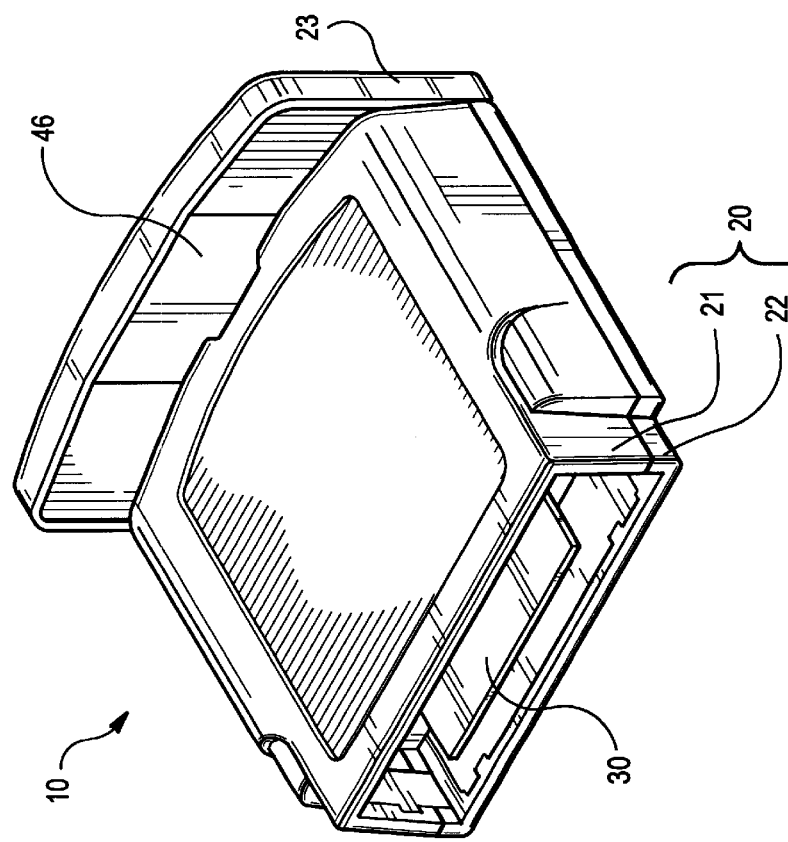
FIG. 1 is a front perspective view from below of a memory expansion pack for a game machine embodying the invention.
Figure 3:
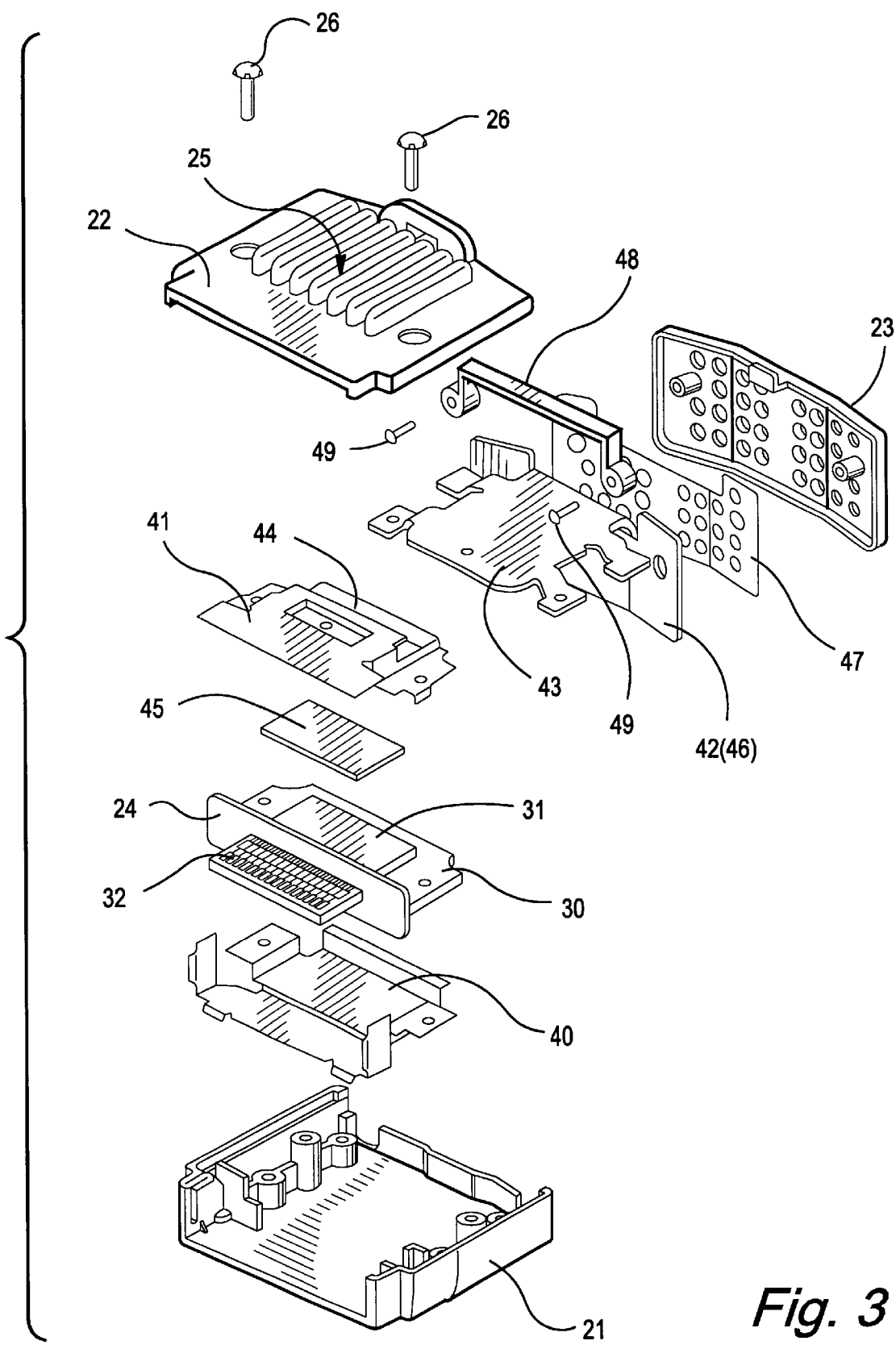
FIG. 3 is an exploded rear perspective view of the expansion pack of FIGS. 1 and 2.

Referring to FIGS. 1 and 3, an memory expansion pack is shown as an example of an electronic accessory embodying the invention. The illustrated expansion pack comprises a cover or housing 20 which is formed, in the illustrated embodiment, from a combination of a first housing half or front cover 21 and a second housing half or rear cover 22. An electronic circuit (not shown in detail) is disposed inside the housing. Board 30, having first and second major surfaces, is mounted within housing 20 and electronic components, shown generally at 31, are provided on at least the second surface of board 30. Board 30 further defines a connector terminal 32 at one end thereof, adjacent the open end of the housing 20, for being received in and engaged with corresponding components in a formed connector of the game machine body (not shown). In the illustrated embodiment, a partition 24 is disposed generally perpendicular to board 30 for closing the housing inwardly of connector terminal 32, to prevent extraneous material from intruding into the housing, past connector 32.

In the illustrated embodiment the principal parts on a first, front side of board 30 are covered with a first shield 40, which is made from a metallic material, by which in this example the board is secured in the housing, as described herein below. Similarly, the principal parts 31 on a second, rear side of board 30 are covered with a second metallic shield 41. A cut, shown at 44, is formed in the second shield 41 to accommodate a terminal end of first heat radiation section or part 43 of heat radiation assembly or framework 42. Thus, the terminal end of section 43 can be inserted into the second shield 41 through cut 44 to be integrated therewith. This fixes section 43 with respect to board 30, with section 43 disposed in parallel to board 30. As an alternative to providing cut 44, first heat radiation section or part 43 could be secured with respect to board such as by being bolted or otherwise mechanically fastened to shield 41, or by being directly secured to a peripheral portion of the board. Furthermore, it is to be understood that while in the illustrated embodiment the first heat radiation section or part 43 is provided as a generally planar component disposed on only one side of board 30, it is evident that in the alternative a first heat radiation section or part could be disposed in parallel, spaced relation to each major surface of board 30 for dissipating the heat generated by the electronic components thereon.

With further reference to FIG. 3, in the presently preferred embodiment, a thermal, heat conducting sheet 45 is disposed between the electronic components on the respective surface of the board 30 and the first heat radiation section. The thermal sheet 45 may be comprise, for example, a sheet of silicone rubber. By connecting the electronic components and radiation framework through a thermal, heat conducting sheet, it is possible to eliminate a joint between the electronic components and the radiation framework.

Thus, the above described assembly allows heat generated by the electronic components to be transferred, through the thermal sheet or layer 45, initially to the first heat radiation section 43 where the heat is dissipated.

Thus, the first section 43 serves to conduct heat generated by, e.g., the electronic components 31, from a vicinity of the components to regions of the assembly remote from those components. Slits 25 are defined in the second, rear housing half 22, between spacer ribs, for exposing first heat radiation section 43 and/or shield 41 to an exterior of the housing for discharge of heat to the housing exterior.

Thus, some of the heat conducted to the rear, second shield 41 and first heat radiation section 43 discharges through slits 25 defined in housing part 22. A remainder of the heat conducted to the first heat radiation section 43 is conducted to a second heat radiation section or part 46 of radiation framework 42. In the illustrated embodiment second heat radiation part 46 is formed integrally in one piece with first heat radiation part 43. However, it is contemplated that each of those parts could be separately formed and mechanically coupled in heat transfer relation and/or each of those parts could themselves be made up of a plurality of heat dissipating/radiating elements mechanically coupled in heat transfer relation to facilitate the dissipation of heat generated by the electronic components 31.

A protective cover 23 is installed to heat radiation section 46 using, e.g., fixing tape 47. In addition, protective cover 23 and radiation framework 42 are firmly attached to a fixed framework 48 with screws 49. As shown in FIG. 1 a portion of the bottom face of second heat radiation part 46 may be left exposed for heat dissipation to the exterior of the housing. Furthermore, in accordance with the presently preferred embodiment, apertures are defined in protective cover 23 for exposing second heat radiation section 46 to the exterior of the housing, and the exterior of the game machine/expansion pack assembly, for discharge of heat. As presently proposed, both the protective cover 23 and fixed framework 48 are formed from a heat resistant resin such as heat resistant ABS.

It is preferred, for aesthetic reasons and to achieve a compact design, for the heat radiation section 46 and the protective cover 23 attached thereto to correspond, e.g., in curvature to the contour of the respective wall of the game machine into which the electronic accessory is to be inserted. The illustrated embodiment is adapted in particular for coupling to a game machine such as the Nintendo 64. Accordingly, in the illustrated embodiment, heat radiation section 46 and the protective cover 23 attached thereto are curved at the side ends thereof, so as to be complementary to the top wall contour of that game machine.

The expansion pack 10 may be assembled as follows: the first or front shield 40 is installed in the first or front half 21 of housing 20. On the opposite side of the board, silicone rubber sheet 45 is bonded to the electronic components 31 mounted on board 30 and is covered with the second or rear shield 41. The radiation framework 42 is coupled to protective cover 23 with fixing tape 47 and fixed firmly to framework 48 via screws 49. The radiation framework 42 with protective cover 23 mounted thereto is then inserted into cut 44 formed in second shield 41. This makes first heat radiation section 43 of the radiation framework 42 contact the silicone rubber 45 to define a heat transfer path from the vicinity of the electronic components to more remote regions of the expansion pack.

Partition 24 is mounted to connector terminal 32 on board 30 and is connected to the first, front shield 40. The rear half 22 of housing 20 is then integrated with the front half 21 of the housing using screws 26. Screws 26 pass through rear shield 41, board 30, front shield 40, and into suitable receptacles in the front half 21 of the housing to provide an integrated assembly with the components fixed relative to one another.

Figure 2:
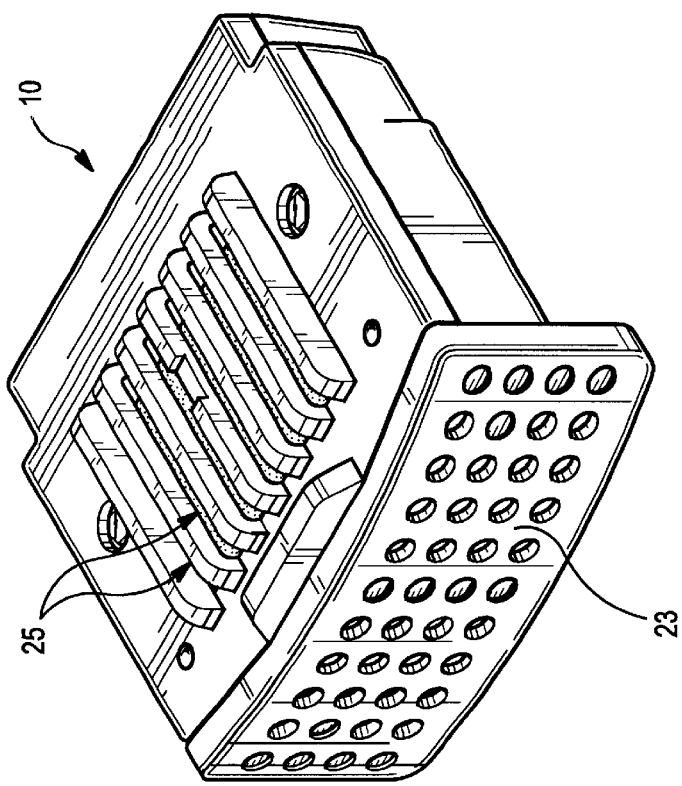
FIG. 2 is a rear perspective view from above of the expansion pack of FIG. 1.
Figure 4:
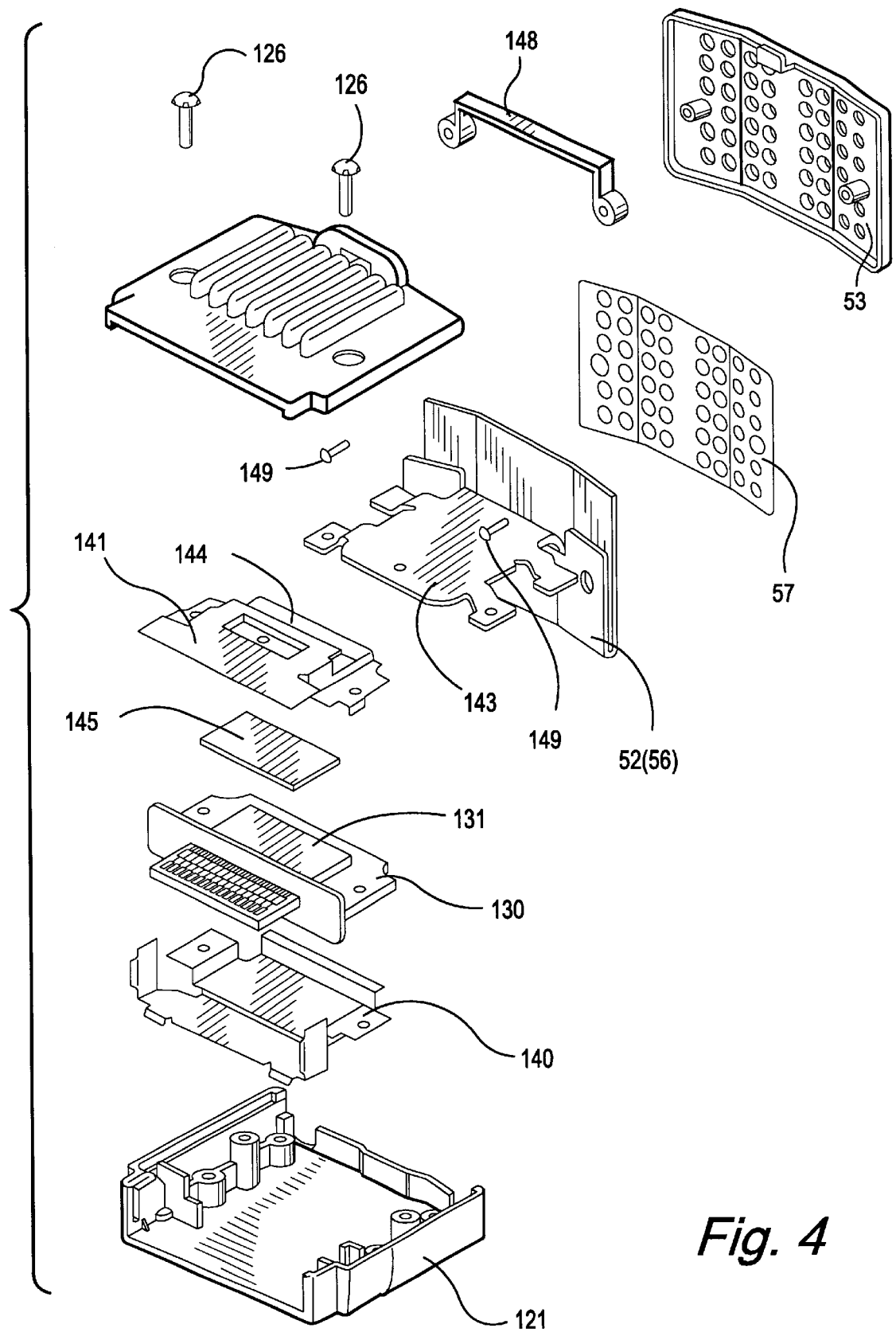
FIG. 4 is an exploded rear perspective view of a second embodiment of a expansion pack embodying the invention.
Figure 5:
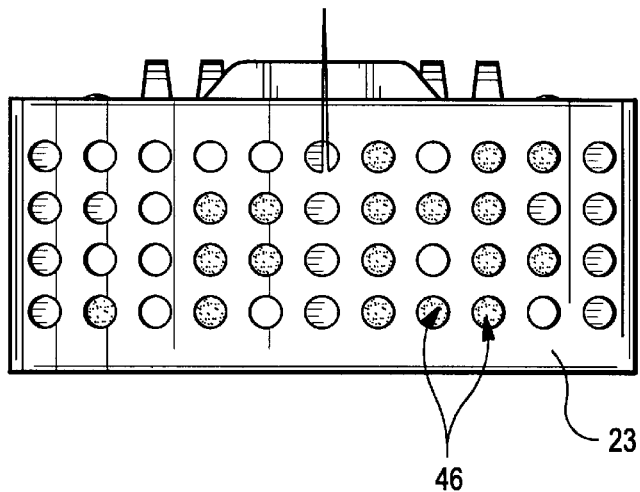
FIG. 5 is a top end view of the expansion pack of FIG. 1.
Figure 6:
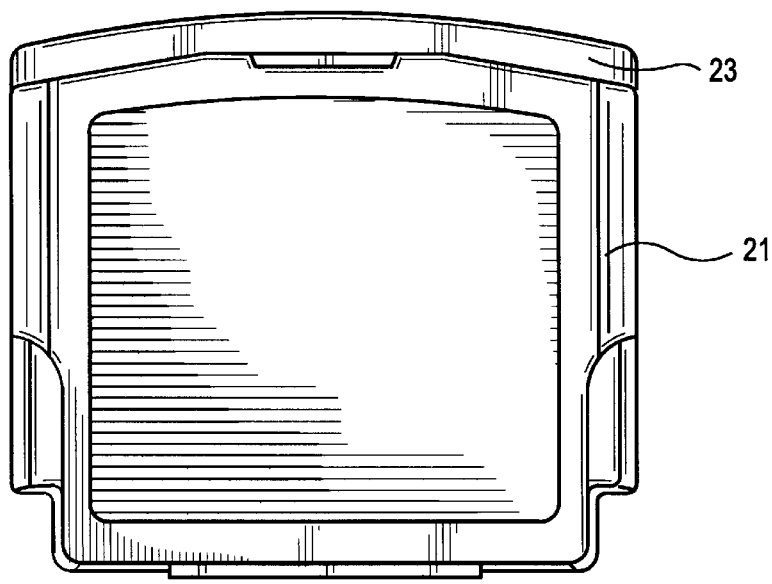
FIG. 6 is a front elevational view of the expansion pack shown in FIG. 1.
Figure 7:
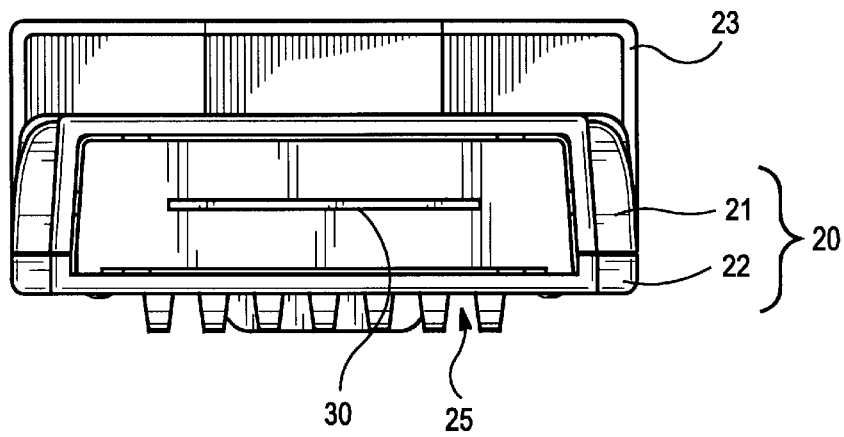
FIG. 7 is a bottom end view of the expansion pack of FIG. 1.
Figure 8:
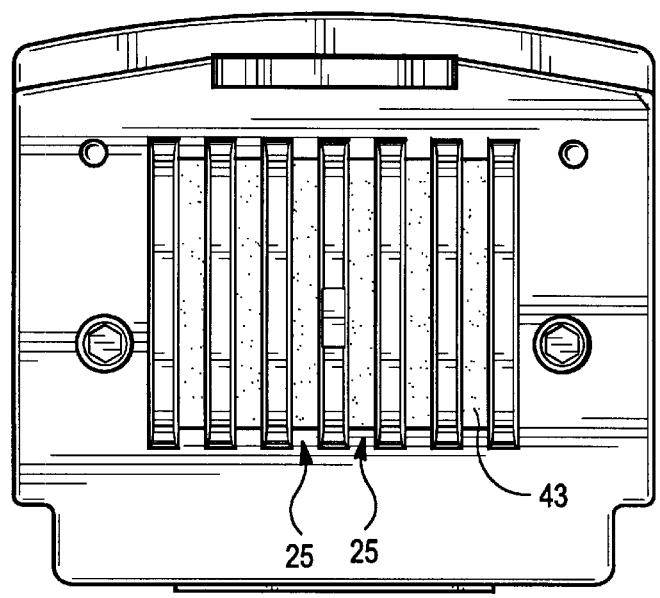
FIG. 8 is a rear elevational view of the expansion pack of FIG. 1.
Figure 9:
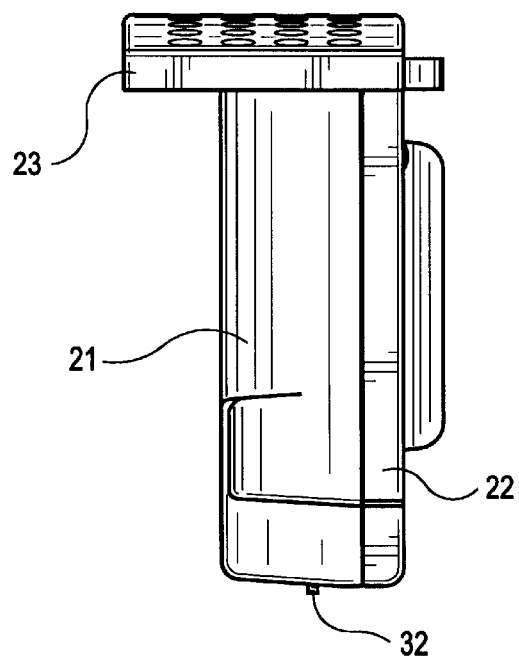
FIG. 9 is a side elevational view of the expansion pack of FIG. 1.

A second embodiment of the invention is illustrated in the exploded view of FIG. 4. This alternate expansion pack 50 includes several components that substantially correspond to the components described above with reference to FIG. 3 and like reference numerals incremented by 100 are used for such corresponding components. However, such corresponding components will be discussed only to the extent necessary or desirable to an understanding of the features of this embodiment. This embodiment differs from the first embodiment primarily in that, in order to even more effectively dissipate and discharge heat from the electronic components, a larger second heat dissipation section 56 is provided. More specifically, rounded part 46 of the FIG. 1 embodiment has been enlarged to project forwardly and rearwardly from the first heat radiation section 143 so as to define an enlarged rounded section 56 of radiation framework 52. Likewise the protective cover 53 is enlarged so as to correspond to the enlarged rounded section 56 and an enlarged fixing tape component 57 is provided corresponding to the complimentarily rounded section 56 and protective cover 53. The remaining components correspond to those shown and described above with reference to FIGS. 1–3. The assembly sequence and heat dissipation likewise corresponds to the embodiment of FIG. 1.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. An electronic accessory for being loaded into a formed connector defined in a game machine body, the electronic accessory comprising:

a housing;

a board supported in the housing, said board having first and second major surfaces, at least one electronic component being disposed on at least said second surface of said board, and a connector being defined at one longitudinal end of said board for being received in and engaged with corresponding components in the formed connector of the game machine body;

said housing having an aperture defined therein for exposing said connector for connection to the corresponding components of the game machine;

a heat radiation assembly disposed within said housing and including a first heat radiation part disposed in parallel spaced relation to said second surface of said board for conducting heat generated by said electronic components from a vicinity of said electronic components to a region remote from said electronic components, at least a portion of said housing disposed in opposed facing relation to said first heat radiation part having a plurality of apertures defined therein for providing for dissipation of heat to an exterior of said housing, and a second heat radiation part disposed in a plane substantially perpendicular to a plane of said first radiation part and disposed in heat transfer relation thereto.

2. An electronic accessory as in claim 1, wherein said first heat radiation part of said heat radiation assembly is formed from a metal material.

3. An electronic accessory as in claim 1, wherein said second heat radiation part defines a substantial L-shape with said first heat radiation part.

4. An electronic accessory as in claim 1, wherein said second radiation part defines a substantial T-shape with said first radiation part.

5. An electronic accessory as in claim 1, wherein said second heat radiation part is integrally formed with said first heat radiation part.

6. An electronic accessory as in claim 1, wherein said housing further comprising a protective shield fixedly secured to said second heat radiation part.

7. An electronic accessory as in claim 6, wherein said protective shield is mechanically secured to said second heat radiation part.

8. An electronic accessory as in claim 7, wherein said protective shield is adhered to said second heat radiation part with a fixing tape.

9. An electronic accessory as in claim 6, wherein said protective shield is formed from a resin material.

10. An electronic accessory as in claim 6, wherein apertures are defined in said protective shield for exposing said second heat radiation part to provide for dissipation of heat.

11. An electronic accessory as in claim 1, further comprising a housing partition plate disposed in a plane substantially perpendicular to a plane of said board for substantially closing said housing adjacent said connector, whereby said connector is exposed for connection to the game machine body and a remainder of an interior of said housing is closed by said partition wall.

12. An electronic accessory as in claim 1, further comprising a thermal sheet interposed between said first heat radiation part and said at least one electronic component on said first surface of the board for transmitting heat therebetween.

13. An electronic accessory as in claim 1, wherein said housing is composed of first and second housing parts mechanically secured to one another.

14. An electronic accessory as in claim 1, wherein said first housing part includes a major surface disposed in parallel to said first major surface of said board and said second housing part includes a major surface disposed in parallel to said second major surface of said board.

15. An electronic accessory as in claim 1, further comprising first and second shield components respectively disposed in parallel spaced relation to said first and second major surfaces of said board.

16. An electronic accessory for being loaded into a formed connector defined in a game machine body, the electronic accessory comprising:

a housing composed of first and second housing parts;

a board supported in the housing, said board having first and second major surfaces and a connector defined at one longitudinal end of said board;

said housing having an aperture defined therein for exposing said connector for connection to corresponding components of the game machine;

at least one of said housing parts having a plurality of slits defined therein for providing for dissipation of heat to an exterior of said housing.

17. An electronic accessory as in claim 16, further comprising a protective shield disposed at one end of said housing, and wherein apertures are defined in said protective shield for providing for dissipation of heat to an exterior of said housing.

18. An electronic accessory as in claim 16, further comprising a heat radiation assembly disposed within said housing and including a first heat radiation part disposed in parallel spaced relation to said second surface of said board for conducting heat generated by electronic components disposed thereon from a vicinity of said electronic components to a region remote from said electronic components, at least said housing part having said slits being disposed in opposed facing relation to said first heat radiation part for providing for dissipation of heat from said first heat radiation part to the exterior of said housing.

19. An electronic accessory as in claim 16, further comprising a second heat radiation part disposed in a plane substantially perpendicular to a plane of said first radiation part and disposed in heat transfer relation thereto.

20. An electronic assembly as in claim 16, further comprising a plurality of fins, each disposed between adjacent said apertures and projecting from a surface of the at least one housing part.

21. An electronic accessory as in claim 19, further comprising a protective shield fixedly secured to said second heat radiation part.

22. An electronic accessory as in claim 21, wherein said protective shield is formed from a resin material.

* * * * *